United States Patent
Chen et al.

(10) Patent No.: US 11,016,340 B2
(45) Date of Patent: May 25, 2021

(54) LED DEVICE, BACKLIGHT MODULE AND DISPLAY DEVICE

(71) Applicant: FOSHAN NATIONSTAR OPTOELECTRONICS CO., LTD, Guangdong (CN)

(72) Inventors: Junhua Chen, Guangdong (CN); Fabo Liu, Guangdong (CN); Danlei Gong, Guangdong (CN); Zhonghai Yan, Guangdong (CN); Xiang Chen, Guangdong (CN); Yao Weng, Guangdong (CN)

(73) Assignee: FOSHAN NATIONSTAR OPTOELECTRONICS CO., LTD, Guangdong (CN)

( * ) Notice: Subject to any disclaimer, the term of this patent is extended or adjusted under 35 U.S.C. 154(b) by 0 days.

(21) Appl. No.: 16/908,772

(22) Filed: Jun. 23, 2020

(65) Prior Publication Data

US 2020/0409215 A1 Dec. 31, 2020

(30) Foreign Application Priority Data

Jun. 28, 2019 (CN) .......................... 201910578865.9

(51) Int. Cl.
*G02F 1/13357* (2006.01)
*H01L 33/56* (2010.01)
*H01L 33/60* (2010.01)

(52) U.S. Cl.
CPC .. *G02F 1/133603* (2013.01); *G02F 1/133605* (2013.01); *H01L 33/56* (2013.01); *H01L 33/60* (2013.01); *G02F 2202/28* (2013.01)

(58) Field of Classification Search
CPC ......... G02F 1/133603; G02F 1/133605; G02F 2202/28; H01L 33/60; H01L 33/56; (Continued)

(56) References Cited

U.S. PATENT DOCUMENTS

2014/0077243 A1* 3/2014 Chang .................... H01L 33/60
257/98
2014/0353688 A1* 12/2014 Pan ........................ H01L 33/642
257/88

(Continued)

FOREIGN PATENT DOCUMENTS

CN 103236488 A 8/2013
CN 103682060 A 3/2014
(Continued)

*Primary Examiner* — Peggy A Neils
(74) *Attorney, Agent, or Firm* — Gang Yu

(57) ABSTRACT

The disclosure provides a LED device, a backlight module and a display device. The LED device includes: a bracket structure and a chip, the bracket structure having a cup cavity and the chip being mounted in the cup cavity; a packaging structure, the packaging structure being provided on the bracket structure in a covering manner to seal the cup cavity and an upper surface, far away from the cup cavity, of the packaging structure forming an emergent surface; and a reflective shielding layer, the reflective shielding layer being provided on the packaging structure and the reflective shielding layer being at a central position of the emergent surface and covering part of the emergent surface. According to the disclosure, the problem in the related art that it is impossible to consider both a good color saturation and brightness contrast of a display of a display device is solved.

20 Claims, 2 Drawing Sheets

(58) Field of Classification Search
CPC ......... H01L 33/52; H01L 33/33; H01L 33/54; H01L 33/62; H01L 2933/0058; H01L 2933/0091; F21Y 2105/10; F21Y 2115/10; F21V 7/0008; F21V 5/046; F21V 7/28

See application file for complete search history.

(56) References Cited

U.S. PATENT DOCUMENTS

| | | | |
|---|---|---|---|
| 2017/0279009 A1* | 9/2017 | Hong | H01L 33/46 |
| 2020/0052171 A1* | 2/2020 | Ye | H01L 33/505 |
| 2020/0159071 A1* | 5/2020 | Yoon | G02F 1/133603 |
| 2020/0161516 A1* | 5/2020 | Sasaoka | G02B 5/1876 |
| 2020/0341185 A1* | 10/2020 | Daikoku | G02B 6/0073 |

FOREIGN PATENT DOCUMENTS

| | | |
|---|---|---|
| CN | 104508351 A | 4/2015 |
| KR | 20080088219 A | 10/2008 |

\* cited by examiner

LED DEVICE, BACKLIGHT MODULE AND DISPLAY DEVICE

CROSS-REFERENCE TO RELATED APPLICATION(S)

The present application claims priority to Chinese Patent Application No. 201910578865.9, filed on Jun. 28, 2019 and entitled "LED Device, Backlight Module and Display Device", the contents of which are hereby incorporated by reference in its entirety.

TECHNICAL FIELD

The disclosure relates to the technical field of LED lamp illumination, and particularly to an LED device, a backlight module and a display device. A structure of the LED device is mainly improved.

BACKGROUND

In recent years, advanced display technologies have been committed to improving the display quality of display devices and implementing brightness increase of bright fields and brightness decrease of dark fields in displayed pictures to achieve higher brightness contrasts to present any detail in the displayed pictures thoroughly to improve viewing experiences of users.

For further improving the picture quality, particularly for the problem of poor contrast representation often attacked by the Organic LED (OLED) group, the Liquid Crystal Display (LCD) industry starts extensively adopting a Local Dimming backlight source technology to realize a High Dynamic Range (HDR) function, thereby greatly improving the contrast representation to the level the same as that of OLED. Therefore, Mini LED backlight source capable of implementing accurate backlight control rapidly becomes a hot research area in this industry. In a mainstream Mini LED backlight source packaging manner, TOP-packaged LED bead-based dense light sources array direct type backlight source is applied extensively, and has relatively great advantages in massive transfer, reliability, cost control, convenience for mass production, late maintenance and the like.

Light emitted from each LED bead light source point on such a backlight source may be mixed by a certain spatial distance to form an area light source. Picture brightness uniformity of the area light source is determined by distances between the LED beam light source points and the spatial optical distance. If the optical distance is longer, the picture uniformity is higher. However, along with increase of a thickness of a backlight display module, if the optical distance is too short, picture graininess is more serious.

At present, the total number of LED beads of a Mini LED backlight source-based ultra-thin display device may usually reach thousands and even tens of thousands, and the economy of the display device is greatly affected. For reducing the cost to make the price of a display device more friendly and improve the competitiveness of the product, reduction in the number of LED beads is required to be considered on the premise of an ultra-thin design of the display device at present. How to effectively control the machining and manufacturing cost of a display device to endow the display device with high economy and market competitiveness and simultaneously ensure a good color saturation and brightness contrast of a display of the display device to meet a viewing experience of a user becomes a problem urgent to be solved in the industry.

SUMMARY

Some embodiments of the disclosure is to provide an LED device, a backlight module and a display device, to solve the problem in the related art that it is impossible to consider both a good color saturation and brightness contrast of a display of a display device and high economy of the display device.

In order to achieve the purpose, according to an embodiment of the disclosure, an LED device is provided, which may include: a bracket structure and a chip, the bracket structure having a cup cavity and the chip being mounted in the cup cavity; a packaging structure, the packaging structure being provided on the bracket structure in a covering manner to seal the cup cavity and an upper surface, far away from the cup cavity, of the packaging structure forming an emergent surface; and a reflective shielding layer, the reflective shielding layer being provided on the packaging structure and the reflective shielding layer being at a central position of the emergent surface and covering part of the emergent surface to uniformly distribute a luminous intensity of the LED device along the emergent surface.

In an exemplary embodiment, a ratio of an area of a part, covered by the reflective shielding layer, of the emergent surface to an area of the emergent surface may be more than or equal to 10% and less than or equal to 95%.

In an exemplary embodiment, light transmittance of the reflective shielding layer may be more than or equal to 0 and less than or equal to 50%.

In an exemplary embodiment, the reflective shielding layer may be formed after shading liquid added dropwise at the central position of the emergent surface naturally flows and is solidified; or the reflective shielding layer may be formed after the shading liquid is sprayed to the central position of the emergent surface through a jig and is solidified; or the reflective shielding layer may be attached to the central position of the emergent surface.

In an exemplary embodiment, the shading liquid may be one of Printed Circuit Board (PCB) white oil, Chip On Board cofferdam glue and printing ink; or the shading liquid may be a liquid mixture of a packaging adhesive and a silicon dioxide; or the shading liquid may be a liquid mixture of a packaging adhesive and a titanium dioxide.

In an exemplary embodiment, the packaging structure may be formed after the packaging adhesive added dropwise into the cup cavity is solidified, and the emergent surface may be part of a surface of a sphere or part of a surface of an ellipsoid.

In an exemplary embodiment, the packaging adhesive may be a thermosetting packaging adhesive, and the thermosetting packaging adhesive may be one of an epoxy packaging adhesive, an organic silicon packaging adhesive and a polyurethane packaging adhesive; or the packaging adhesive may be a light-cured packaging adhesive, and the light-cured packaging adhesive may be one of an UV curable adhesive and an Infrared curable adhesive.

In an exemplary embodiment, an average light-emitting angle range, corresponding to a relative light intensity of 50% or above at the emergent surface, of the LED device may be more than or equal to 175 degrees.

In an exemplary embodiment, an average light-emitting angle range, corresponding to a relative light intensity of 90% or above at the emergent surface, of the LED device may be more than or equal to 90 degrees.

According to another embodiment of the disclosure, a backlight module is provided, which may include a substrate and an LED device, the LED device being the abovementioned LED device, wherein there may be multiple LED devices, the multiple LED devices may be distributed on the substrate in form of a matrix, and a center distance between two adjacent LED devices of the multiple LED devices may be more than or equal to 1 mm and less than or equal to 12 mm.

According to another embodiment of the disclosure, a display device is provided, which may include a backlight module and an optical module that are spaced, wherein the backlight module may be the abovementioned backlight module, and the optical module may include an optical component layer, a conversion film layer and a liquid crystal glass layer.

In an exemplary embodiment, a spacing distance between the backlight module and the optical module may be more than or equal to 1 mm and less than or equal to 12 mm.

With adoption of the technical solutions of the disclosure, a structural design of the LED device is optimized and improved, so that a light intensity distribution on the emergent surface of the LED device is effectively regulated and optimized. Specifically, the reflective shielding layer is provided on the emergent surface of the packaging structure of the LED device, and the reflective shielding layer is arranged at the central position of the emergent surface to cover part of the emergent surface, so that the luminous intensity of the LED device may be uniformly distributed along the emergent surface, and the brightness uniformity of an area light source formed by the backlight module with multiple such LED devices is further improved. In an exemplary embodiment, it may be ensured that a display of the display device has a good color saturation and brightness contrast, and on this premise, when the backlight module is manufactured, a distance between point light sources, i.e., the LED devices, may be expanded, so that the number of adopted LED devices is greatly reduced, the overall cost of the display device is reduced, the economy of the display device is improved, meanwhile, the thickness of the display device may also be reduced, an ultra-thin design of the display device is also considered, and the practicability of the display device is improved.

BRIEF DESCRIPTION OF THE DRAWINGS

The drawings forming a part of the present application in the specification are adopted to provide a further understanding to the disclosure. Schematic embodiments of the disclosure and descriptions thereof are adopted to explain the disclosure and not intended to form improper limits to the disclosure. In the drawings.

Herein, the drawings include the following reference signs:

1: backlight module; 2: optical module; 100: substrate; 200: LED device; 10: bracket structure; 11: cup cavity; 20: chip; 30: packaging structure; 31: emergent surface; and 40: reflective shielding layer.

DETAILED DESCRIPTION OF THE EMBODIMENTS

The technical solutions in embodiments of the disclosure will be clearly and completely described below in combination with the drawings in the embodiments of the disclosure. It is apparent that the described embodiments are only part of the embodiments of the disclosure but not all of the embodiments. The following description of at least one exemplary embodiment is only illustrative actually, and is not used as any limitation for the disclosure and the present application or use thereof. All other embodiments obtained by those of ordinary skill in the art based on the embodiments in the disclosure without creative work shall fall within the scope of protection of the disclosure.

Figure 2:
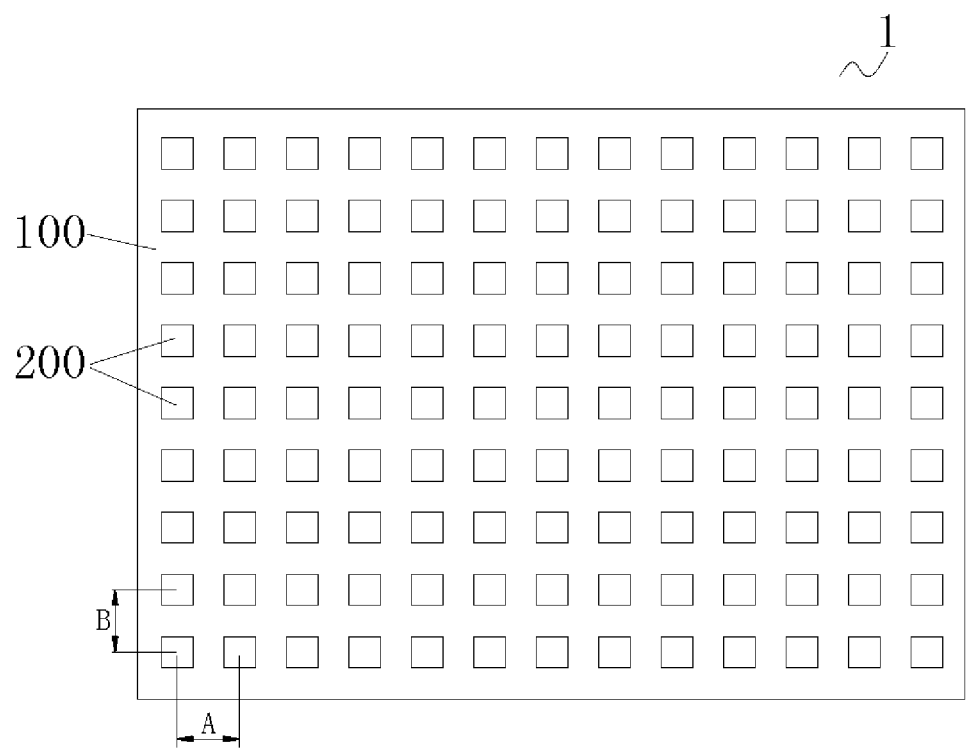
FIG. 2 is a schematic diagram of an LED device distribution state of a backlight module with multiple LED devices in FIG. 1 according to an optional embodiment of the disclosure.
Figure 3:
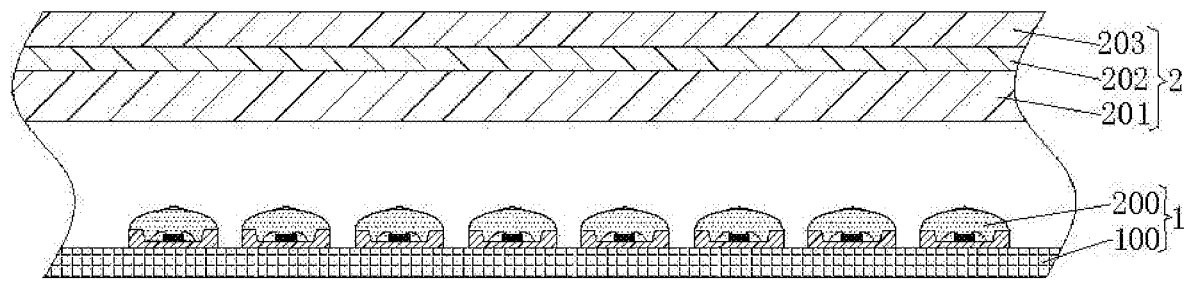
FIG. 3 is a partial structure diagram of a display device with the backlight module in FIG. 2 according to an optional embodiment of the disclosure.

For solving the problem in the related art that it is impossible to consider both a good color saturation and brightness contrast of a display of a display device and high economy of the display device, the disclosure provides an LED device, a backlight module and a display device. As shown in FIG. 3, the display device includes a backlight module 1 and an optical module 2 that are spaced, the backlight module 1 is the abovementioned and undermentioned backlight module 1, and the optical module 2 includes an optical component layer 201, a conversion film layer 202 and a liquid crystal glass layer 203. As shown in FIG. 2, the backlight module 1 includes a substrate 100 and an LED device 200, the LED device 200 is the abovementioned and undermentioned LED device 200, there are multiple LED devices 200, and the multiple LED devices 200 are distributed on the substrate 100 in form of a matrix.

In an exemplary embodiment, a center distance between two adjacent LED devices 200 is more than or equal to 1 mm and less than or equal to 12 mm.

Figure 1:
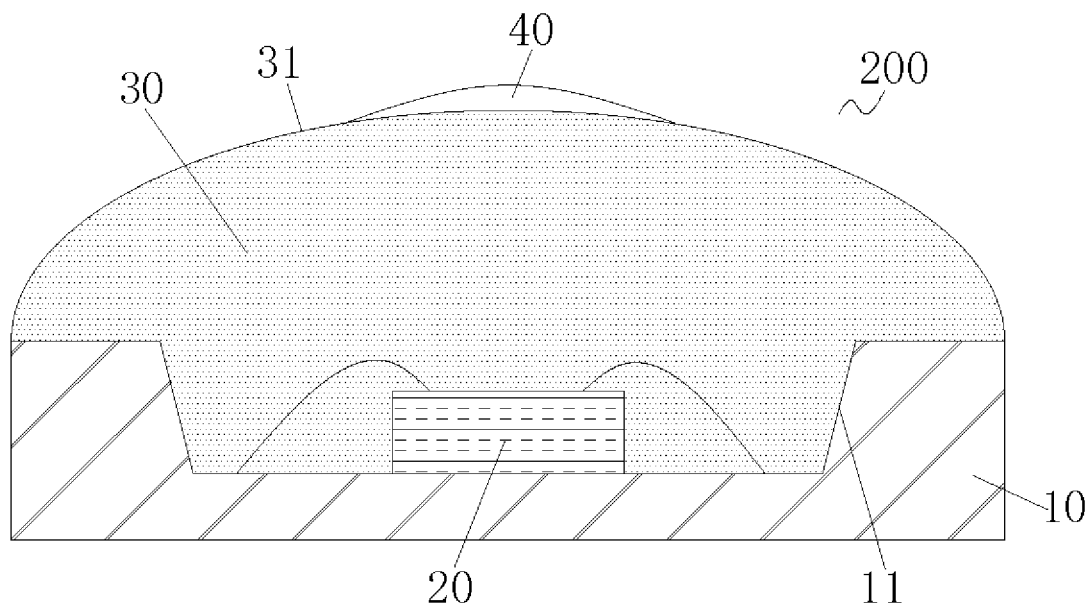
FIG. 1 is a structure diagram of an LED device according to an optional embodiment of the disclosure.

As shown in FIG. 1, the LED device 200 includes a bracket structure 10, a chip 20, a packaging structure 30 and a reflective shielding layer 40. The bracket structure 10 has a cup cavity, and the chip 20 is mounted in the cup cavity 11. The packaging structure 30 is provided on the bracket structure 10 in a covering manner to seal the cup cavity 11, and an upper surface, far away from the cup cavity 11, of the packaging structure 30 forms an emergent surface 31. The reflective shielding layer 40 is provided on the packaging structure 30, and the reflective shielding layer 40 is at a central position of the emergent surface 31 and covers part of the emergent surface 31 to uniformly distribute a luminous intensity of the LED device along the emergent surface 31.

A structural design of the LED device 200 is optimized and improved, so that a light intensity distribution on the emergent surface 31 of the LED device 200 is effectively regulated and optimized. Specifically, the reflective shielding layer 40 is provided on the emergent surface 31 of the packaging structure 30 of the LED device 200, and the reflective shielding layer 10 is arranged at the central position of the emergent surface 31 to cover part of the emergent surface 31, so that the luminous intensity of the LED device 200 may be uniformly distributed along the emergent surface 31, and the brightness uniformity of an area light source formed by the backlight module 1 with multiple such LED devices 200 is further improved. Furthermore, it may be ensured that a display of the display device has a good color saturation and brightness contrast, and on this premise, when the backlight module 1 is manufactured, a distance between point light sources of the LED devices 200, may be expanded, so that the number of adopted LED devices 200 is greatly reduced, the overall cost of the display device is reduced, the economy of the display device is improved, meanwhile, the thickness of the display device may also be reduced, an ultra-thin design of the display device is also considered, and the practicability of the display device is improved.

For regulating and optimizing the light intensity distribution on the emergent surface 31 of the LED device 200 more accurately, a ratio of an area of a part, covered by the reflective shielding layer 40, of the emergent surface 31 to an area of the emergent surface 31 is optionally more than or equal to 10% and less than or equal to 95%.

For controlling the transmission rate of light emitted by the chip 20 for the packaging structure 30 and the reflective shielding layer 40 more accurately, light transmittance of the reflective shielding layer 40 is optionally more than or equal to 0 and less than or equal to 50%.

The present application provides three preferred forming manners for the reflective shielding layer 40. Not only may the LED device 200 be conveniently machined and manufactured, but also the light intensity distribution on the emergent surface 31 of the LED device 200 may be optimized well.

In an exemplary embodiment, the reflective shielding layer 40 is formed after shading liquid added dropwise at the central position of the emergent surface 31 naturally flows and is solidified.

In another exemplary embodiment, the reflective shielding layer 40 is formed after the shading liquid is sprayed to the central position of the emergent surface 31 through a jig and is solidified.

In another exemplary embodiment, the reflective shielding layer 40 is attached to the central position of the emergent surface 31.

In an exemplary embodiment, the shading liquid is one of PCB white oil, Chip On Board cofferdam glue and printing ink. In another exemplary embodiment, the shading liquid is a liquid mixture of a packaging adhesive and a silicon dioxide. In another exemplary embodiment, the shading liquid is a liquid mixture of a packaging adhesive and a titanium dioxide. The shading liquid adopting the above-mentioned materials is low in cost and readily available, and the reflective shielding layer 40 formed after it is solidified has stable performance of connection with the packaging structure 30.

In the disclosure, the packaging structure 30 is formed after the packaging adhesive added dropwise into the cup cavity 11 is solidified, and the emergent surface 31 is part of a surface of a sphere or part of a surface of an ellipsoid. Therefore, the packaging structure 30 acts to protect the chip 20, the packaging structure 30 also has a lens function, and an outline structure of the packaging structure 30 is designed to promote light divergence, enlarge a light-emitting angle of the LED device 200 and improve the luminous performance of the LED device 200.

Optionally, the packaging adhesive is a thermosetting packaging adhesive, and the thermosetting packaging adhesive is one of an epoxy packaging adhesive, an organic silicon packaging adhesive and a polyurethane packaging adhesive; or the packaging adhesive is a light-cured packaging adhesive, and the light-cured packaging adhesive is one of a UV curable adhesive and an IR curable adhesive. Therefore, the materials are readily available, and reduction in the machining and manufacturing cost of the LED device 200 is facilitated.

It is to be noted that, with adoption of the technical solutions of the present application, the light source intensity distribution of the LED device 200 is changed again through the reflective shielding layer 40, and a light distribution curve is secondarily optimized to better facilitate large-distance design of a light source point of the LED device 200, i.e., a light source point, thereby reducing the number of the adopted LED devices 200 and achieving the picture uniformity light and thin structure of a Mini LED.

In the disclosure, an average light-emitting angle range, corresponding to a relative light intensity of 50% or above at the emergent surface 31, of the LED device 200 is more than or equal to 175 degrees. It can be seen that the relative light intensity of the LED device 200 is uniformly distributed in a relatively large light-emitting angle range and a distribution region is large.

In an exemplary embodiment, in a power-up state of the chip 20, the LED device 200 is captured based on a virtual section passing through a geometric center of the chip 20 and perpendicular to a top surface of the bracket structure 10, and an average light-emitting angle range, corresponding to a relative light intensity of 50% or above along an intersection line of the vertical section and an upper surface thereof, of the LED device 200 is more than or equal to −90 degrees and less than or equal to 90 degrees.

In the disclosure, an average light-emitting angle range, corresponding to a relative light intensity of 90% or above at the emergent surface 31, of the LED device 200 is more than or equal to 90 degrees. It can be seen that a regional range where the LED device 200 has a relatively high light intensity in a relatively large light-emitting angle range is also large.

In an exemplary embodiment in the power-up state of the chip 20, the LED device 200 is captured based on the virtual section passing through the geometric center of the chip 20 and perpendicular to the top surface of the bracket structure 10, and an average light-emitting angle range, corresponding to a relative light intensity of 50% or above along the intersection line of the vertical section and the upper surface thereof, of the LED device 200 is more than or equal to −70 degrees and less than or equal to 70 degrees.

Figure 4:
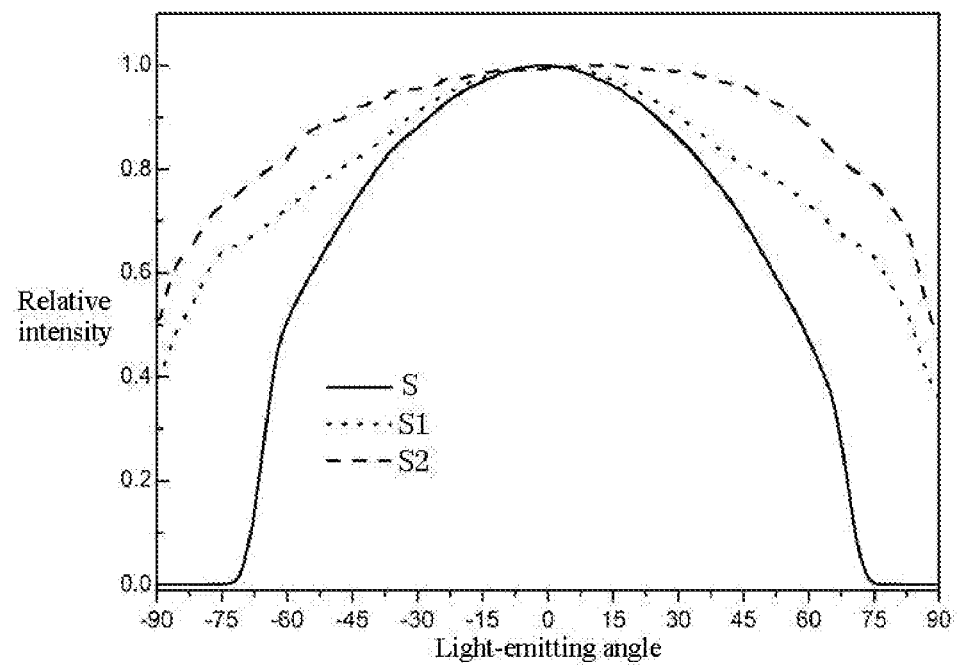
FIG. 4 is a comparison diagram of a luminous property of an LED device in the present application and a luminous property of an LED device in the related art, S being a light intensity distribution curve of the LED device in the related art, S1 being a light intensity distribution curve of the LED device (a reflective shielding layer is omitted) in the present application and S2 being a light intensity distribution curve of the LED device (with a packaging structure and the reflective shielding layer) in the present application.

FIG. 4 is a comparison diagram of a luminous property of an LED device 200 in the present application and a luminous property of an LED device in the related art, S being a light intensity distribution curve of the LED device in the related art, S1 being a light intensity distribution curve of the LED device 200 (a reflective shielding layer is omitted) in the present application and S2 being a light intensity distribution curve of the LED device 200 (with a packaging structure and the reflective shielding layer) in the present application.

Specifically, S is a light intensity distribution curve of a conventional bracket type LED device. It can be seen that a light intensity distribution of a conventional horizontal cup packaged LED device 200 is approximate to a Lambertian distribution and a light intensity is highest in a middle light-emitting angle range of −15° to 15° and rapidly progressively decreases to the two sides. The light-emitting angle value of a test LED device is 119.8° (based on the relative light intensity of 50%). This is bad for large-distance design of the LED device light source point.

It can be seen according to S1 that, after packaging of a backlight LED device with a packaging structure, the light intensity distribution of the LED device obviously changes under the action of the elliptic lens packaging structure. A light distribution density increases in two light-emitting angle regions of −15° to −90° and 15° to 90° such that an overall light-emitting angle of the LED device is enlarged to 168.3° (based on the relative light intensity of 50%). This shows that, after packaging with the packaging structure, more light is reoriented to a large viewing angle. However, the light distribution curve is observed to obtain that the light intensity is still highest in middle of the light-emitting angle region of −15° to 15° and still progressively decreases to the two sides obviously and middle strong light spots still exist.

In an exemplary embodiment, it can be seen according to S2 that, after the reflective shielding layer is additionally arranged at the top end of the packaging structure, the light intensity distribution in the middle region of the light distribution curve of the LED device gets smooth, strong spots are eliminated, and the light intensity changes gently and transitions smoothly in the light-emitting angle range of −45° to 45°. The light-emitting angle value of the test LED device is 178.5° (based on the relative light intensity of 50%). The light-emitting angle is extremely large and the middle light intensity is distributed smoothly. This is the greatest advantage of the LED device 200. Therefore, the LED device is more favorable for meeting a requirement on the picture brightness uniformity of the display device. Under the same light source distance, the optical distance may be shorter, so that the display device may be manufactured to be thinner. Or, when the optical distance is fixed, the number of single light sources of the LED devices, may be reduced along with increase of the light source distance, which is favorable for reducing the cost. For example, when the optical distance of the backlight module is 5 mm, the number of LED devices required by a unit area of the Mini LED backlight module manufactured by use of the LED device of the disclosure is only 30% of that of a Mini LED backlight source component adopting a conventional LED bead array, and the cost is considerably reduced, so that the price of the product is more friendly, and the competitiveness of the product is indirectly effectively improved.

In an exemplary embodiment, a spacing distance between the backlight module 1 and optical module 2 of the display device of the present application is more than or equal to 1 mm and less than or equal to 12 mm. This is more favorable for controlling the thickness of the display device.

The above is only the preferred embodiment of the disclosure and not intended to limit the disclosure. For those skilled in the art, the disclosure may have various modifications and variations. Any modifications, equivalent replacements, improvements and the like made within the spirit and principle of the disclosure shall fall within the scope of protection of the disclosure.

What is claimed is:

1. An LED device, comprising:
a bracket structure and a chip, the bracket structure having a cup cavity and the chip being mounted in the cup cavity;
a packaging structure, the packaging structure being provided on the bracket structure in a covering manner to seal the cup cavity and an upper surface, far away from the cup cavity, of the packaging structure forming an emergent surface; and
a reflective shielding layer, the reflective shielding layer being provided on the packaging structure and the reflective shielding layer being at a central position of the emergent surface and covering part of the emergent surface to uniformly distribute a luminous intensity of the LED device along the emergent surface, the emergent surface is part of a surface of a sphere or part of a surface of an ellipsoid, an outer surface of the reflective shielding layer is protruded out of the emergent surface of the packaging structure along a direction away from the bracket structure.

2. The LED device as claimed in claim 1, wherein a ratio of an area of a part, covered by the reflective shielding layer, of the emergent surface to an area of the emergent surface is more than or equal to 10% and less than or equal to 95%.

3. The LED device as claimed in claim 1, wherein light transmittance of the reflective shielding layer is more than or equal to 0 and less than or equal to 50%.

4. The LED device as claimed in claim 1, wherein
the reflective shielding layer is formed after shading liquid added dropwise at the central position of the emergent surface naturally flows and is solidified; or
the reflective shielding layer is formed after the shading liquid is sprayed to the central position of the emergent surface through a jig and is solidified; or
the reflective shielding layer is attached to the central position of the emergent surface.

5. The LED device as claimed in claim 4, wherein
the shading liquid is one of Printed Circuit Board white oil, Chip On Board cofferdam glue and printing ink; or
the shading liquid is a liquid mixture of a packaging adhesive and a silicon dioxide; or
the shading liquid is a liquid mixture of a packaging adhesive and a titanium dioxide.

6. The LED device as claimed in claim 1, wherein the packaging structure is formed after a packaging adhesive added dropwise into the cup cavity is solidified.

7. The LED device as claimed in claim 6, wherein
the packaging adhesive is a thermosetting packaging adhesive, and the thermosetting packaging adhesive is one of an epoxy packaging adhesive, an organic silicon packaging adhesive and a polyurethane packaging adhesive; or
the packaging adhesive is a light-cured packaging adhesive, and the light-cured packaging adhesive is one of an UV curable adhesive and an Infrared curable adhesive.

8. The LED device as claimed in claim 6, wherein an average light-emitting angle range, corresponding to a relative light intensity of 50% or above at the emergent surface, of the LED device is more than or equal to 175 degrees.

9. The LED device as claimed in claim 6, wherein an average light-emitting angle range, corresponding to a relative light intensity of 90% or above at the emergent surface, of the LED device is more than or equal to 90 degrees.

10. A backlight module, comprising:
a substrate; and
an LED device, the LED device being the LED device as claimed in claim 1, wherein there are multiple LED devices, the multiple LED devices are distributed on the substrate in form of a matrix, and a center distance between two adjacent LED devices of the multiple LED devices is more than or equal to 1 mm and less than or equal to 12 mm.

11. A display device, comprising a backlight module and an optical module that are spaced, wherein the backlight module is the backlight module as claimed in claim 10, and the optical module comprises an optical component layer, a conversion film layer and a liquid crystal glass layer.

12. The display device as claimed in claim 11, wherein a spacing distance between the backlight module and the optical module is more than or equal to 1 mm and less than or equal to 12 mm.

13. The backlight module as claimed in claim 10, wherein a ratio of an area of a part, covered by the reflective shielding layer, of the emergent surface to an area of the emergent surface is more than or equal to 10% and less than or equal to 95%.

14. The backlight module as claimed in claim 10, wherein light transmittance of the reflective shielding layer is more than or equal to 0 and less than or equal to 50%.

15. The backlight module as claimed in claim 10, wherein
the reflective shielding layer is formed after shading liquid added dropwise at the central position of the emergent surface naturally flows and is solidified; or
the reflective shielding layer is formed after the shading liquid is sprayed to the central position of the emergent surface through a jig and is solidified; or
the reflective shielding layer is attached to the central position of the emergent surface.

16. The backlight module as claimed in claim 15, wherein
the shading liquid is one of Printed Circuit Board white oil, Chip On Board cofferdam glue and printing ink; or
the shading liquid is a liquid mixture of a packaging adhesive and a silicon dioxide; or
the shading liquid is a liquid mixture of a packaging adhesive and a titanium dioxide.

17. The backlight module as claimed in claim 10, wherein the packaging structure is formed after a packaging adhesive added dropwise into the cup cavity is solidified, and the emergent surface is part of a surface of a sphere or part of a surface of an ellipsoid.

18. The backlight module as claimed in claim 17, wherein
the packaging adhesive is a thermosetting packaging adhesive, and the thermosetting packaging adhesive is one of an epoxy packaging adhesive, an organic silicon packaging adhesive and a polyurethane packaging adhesive; or
the packaging adhesive is a light-cured packaging adhesive, and the light-cured packaging adhesive is one of an UV curable adhesive and an Infrared curable adhesive.

19. The backlight module as claimed in claim 17, wherein an average light-emitting angle range, corresponding to a relative light intensity of 50% or above at the emergent surface, of the LED device is more than or equal to 175 degrees.

20. The backlight module as claimed in claim 17, wherein an average light-emitting angle range, corresponding to a relative light intensity of 90% or above at the emergent surface, of the LED device is more than or equal to 90 degrees.

* * * * *